United States Patent [19]
Court

[11] 3,949,308
[45] Apr. 6, 1976

[54] VARACTOR CONTROL UNIT USING Q VARIABLE INDUCTANCES

[75] Inventor: Patrick R. J. Court, Los Angeles, Calif.

[73] Assignee: Oak Industries, Inc., Crystal Lake, Ill.

[22] Filed: Nov. 26, 1974

[21] Appl. No.: 527,488

[52] U.S. Cl. .............................................. 325/465
[51] Int. Cl.² ........................................ H04B 1/16
[58] Field of Search ........... 325/422, 423, 452, 453, 325/454, 457, 427, 465, 490, 464; 178/DIG. 19

[56] References Cited
UNITED STATES PATENTS

| | | | |
|---|---|---|---|
| 2,196,881 | 4/1940 | Wheeler | 325/427 |
| 3,196,350 | 7/1965 | Dimon | 325/26 |
| 3,264,566 | 8/1966 | Kaufman et al. | 325/465 |

Primary Examiner—Albert J. Mayer
Attorney, Agent, or Firm—Kinzer, Plyer, Dorn & McEachran

[57] ABSTRACT

A circuit for providing TV channel selection and tuning voltages utilizes a plurality of fixed resistors and a plurality of Q variable inductances. A channel selection switch connects particular resistors and Q variable inductances for channel selection and fine tuning. The Q variable inductances are used for fine tuning and are connected in circuit with an oscillator and a detector. The Q variable inductances each have an adjustable steel core with the position of the core determining the amplitude of the detected oscillator voltage and thus the fine tuning control voltage.

20 Claims, 2 Drawing Figures

VARACTOR CONTROL UNIT USING Q VARIABLE INDUCTANCES

SUMMARY OF THE INVENTION

The present invention relates to television tuning and channel selection and has particular application to a circuit for providing TV channel selection and fine tuning voltages for varactor tuning diodes without the use of the conventional adjustable potentiometers.

A primary purpose of the invention is a simply-constructed reliably operable relatively inexpensive circuit for providing TV channel selection and tuning voltages.

Another purpose is a circuit of the type described using Q variable inductances for fine tuning.

Another purpose is a control unit of the type described which interfaces between a varactor tuner in a television receiver and the channel selection switch operable by the viewer.

Another purpose is a control unit of the type described which allows the viewer to select and fine tune both VHF and UHF channels.

Another purpose is a control unit of the type described which is adaptable to work with a large number of different varactor tuners.

Another purpose is a control unit of the type described utilizing Q variable inductances in combination with a reference oscillator signal to develop AC voltages which vary as a function of the variable Q.

Another purpose is an interface control unit of the type described adaptable for use with various types of channel selection means and fine tuning means.

Another purpose is a control unit of the type described in which the tuning range of the Q variable inductance is sufficiently large to permit three UHF channels at each switch position allotted for UHF channels.

Another purpose is a control unit which uses a Q variable inductance with a stable oscillator and a detector to develop a variable DC voltage.

Another purpose is a control unit of the type described associating a Q variable inductance with a mechanical memory system.

Another purpose is a control unit using a reference AGC control circuit having properties similar to the voltage sensing circuit for circuit symmetry.

Another purpose is a control circuit of the type described using voltage doubler-type rectifiers to reduce the magnitude of the required AC signal.

Another purpose is a control circuit of the type described which adds a variable voltage component to a fixed platform voltage to provide an appropriate ratio of variable to mean tuning voltage for all channel positions.

Another purpose is a control circuit of the type described using a negative voltage supply to modify the ratio of variable to mean tuning voltage as a function of channel selection position to assure an appropriate tuning range on all channel positions.

Other purposes will appear in the ensuing specification, drawings and claims.

BRIEF DESCRIPTION OF THE DRAWINGS

The invention is illustrated diagrammatically in the following drawings wherein.

DESCRIPTION OF THE PREFERRED EMBODIMENT

It is conventional practice in providing channel selection and fine tuning voltages for varactor diodes to utilize potentiometers, one for each channel or switch position. However, the cost of the potentiometers becomes prohibitive when there is an attempt to provide the same basic channel selection and tuning for UHF channels as for VHF channels. Although the present invention should not be limited to any particular number of switch positions, a 36-position switch arrangement has been found to be practical, as it provides for 12 VHF positions and 24 UHF positions. With three UHF channels allotted to each position, the entire band of 70 UHF channels and 12 VHF channels can be covered in a single switching mechanism.

The fine tuning voltage for both the VHF and UHF channels is provided by Q variable inductances. The Q variation is obtained by substituting cold rolled steel adjusting screws in place of the aluminum screws which are customarily used in a conventional memory fine tuning mechanism for varying the tuner oscillator frequency. Cold rolled steel has a resistivity which is relatively high in comparison and, when used as an adjustable core material, the resultant power dissipation caused by the induced eddy currents in the core is reflected back as an apparent loading resistance. The Q of the coil is therefore substantially reduced. At the same time, however, cold rolled steel has a permeability in excess of unity, which creates an increase of inductance of the coil which approximately cancels out the decrease of inductance due to the short circuit turns effect of the solid metal core, with the net result that the inductance change due to the core is almost zero. Only the Q varies significantly as a function of the position of the core within the coil.

By providing a generally constant frequency signal, and by coupling this signal to a sensing circuit which includes a Q variable inductance, it is possible to vary the amplitude of the oscillator signal in accordance with core position and thus to control the output voltage from the sensing circuit which is subsequently rectified and used as a fine tuning voltage.

Figure 1:
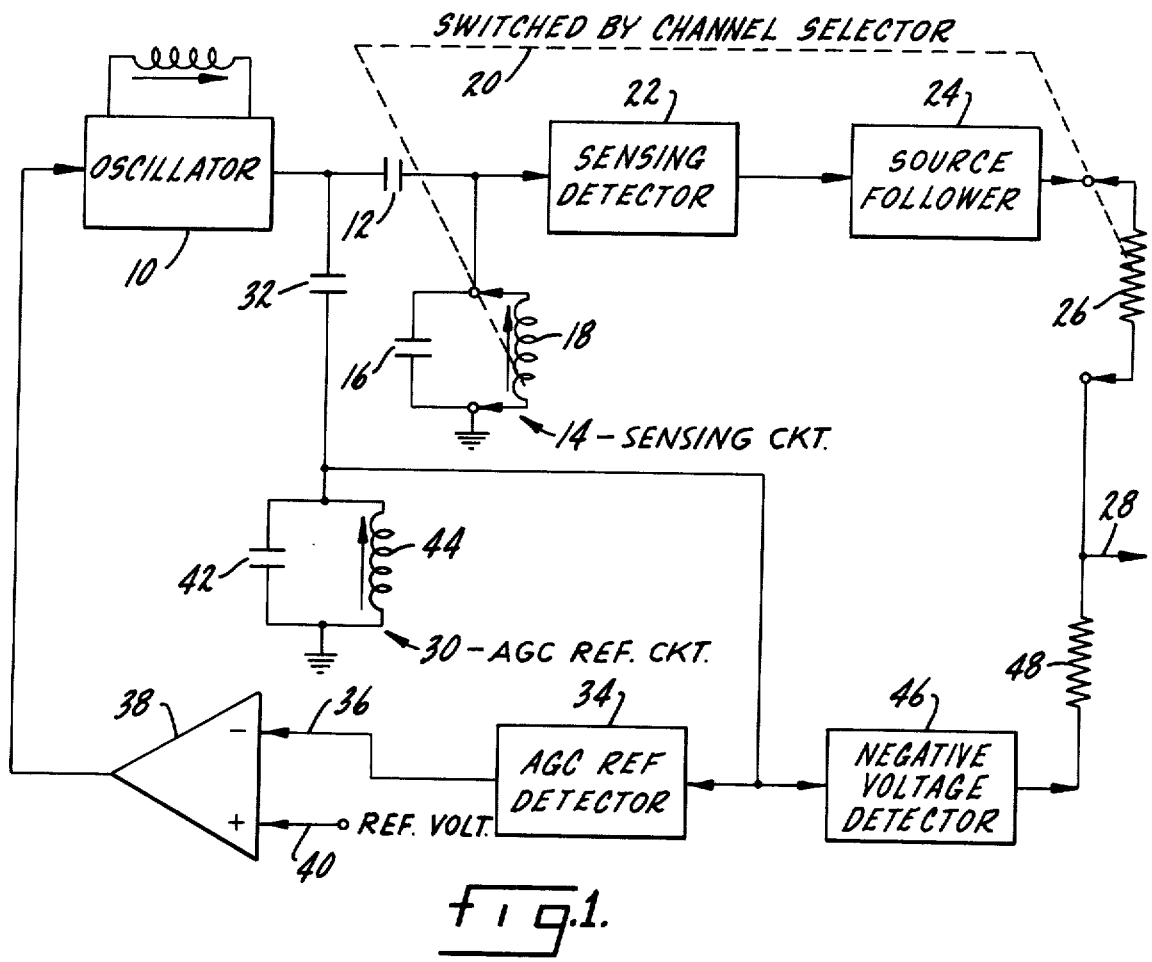
FIG. 1 is a block diagram of the control unit of the type described.

In FIG. 1, an oscillator is indicated generally at 10 and, although the precise output frequency of the oscillator may vary, 8 mhz has been found to be a satisfactory signal. The oscillator 10 is coupled through a capacitor 12 to a sensing circuit 14 in the form of the parallel combination of a capacitor 16 and a Q variable inductance 18. In practice, assuming there are 36 positions for the channel selection switch, the switching mechanism diagrammatically indicated at 20 will connect any one of 36 Q variable inductances in parallel with the capacitor 16. The bottom side of the tank circuit or sensing circuit 14 is connected to ground and the top side is connected to capacitor 12 and to a sensing detector 22.

The output from the sensing detector 22 is connected to source follower circuit 24, with the output from the source follower 24 being connected through a resistor 26 to the output terminal 28. Again assuming a 36-position switching mechanism, there will be a different resistor 26 for each channel selection position. Whenever the switching mechanism 20 connects a Q variable inductance in circuit with capacitor 16, it will simultaneously connect the appropriate resistor 26 in circuit with the source follower and output terminal 28.

An AGC reference circuit is indicated at 30 and is coupled by a capacitor 32 to the output of oscillator 10. To provide symmetry between the sensing circuit and sensing detector on one hand, and the AGC reference circuit and its associated detector on the other, capacitances 12 and 32 are as close to identical as possible. An AGC reference detector 34 is connected to one side of the tank circuit 30, with the output from the reference detector 34 being connected to one input terminal 36 of an operational amplifier 38. The other terminal 40 of amplifier 38 will be connected to a reference source of voltage. The output from operational amplifier 38 is connected to the oscillator 10 for providing automatic gain control.

The AGC reference circuit 30 may include a capacitor 42 and a coil 44, with the characteristics of the capacitor 42 and coil 44 being matched as closely as possible to the characteristics of capacitor 16 and Q variable coil 18 in the sensing circuit 14 to provide circuit symmetry.

Also connected to the AGC reference circuit 30 is a negative voltage detector 46 whose output is connected through a resistor 48 to the bottom of resistors 26 and to output terminal 28.

As indicated above, the purpose of the present control circuit is to provide varactor control voltages for channel selection and memory fine tuning. These voltages will be present on the output terminal 28 and are adaptable for use with a variety of different varactor television tuners.

Figure 2:
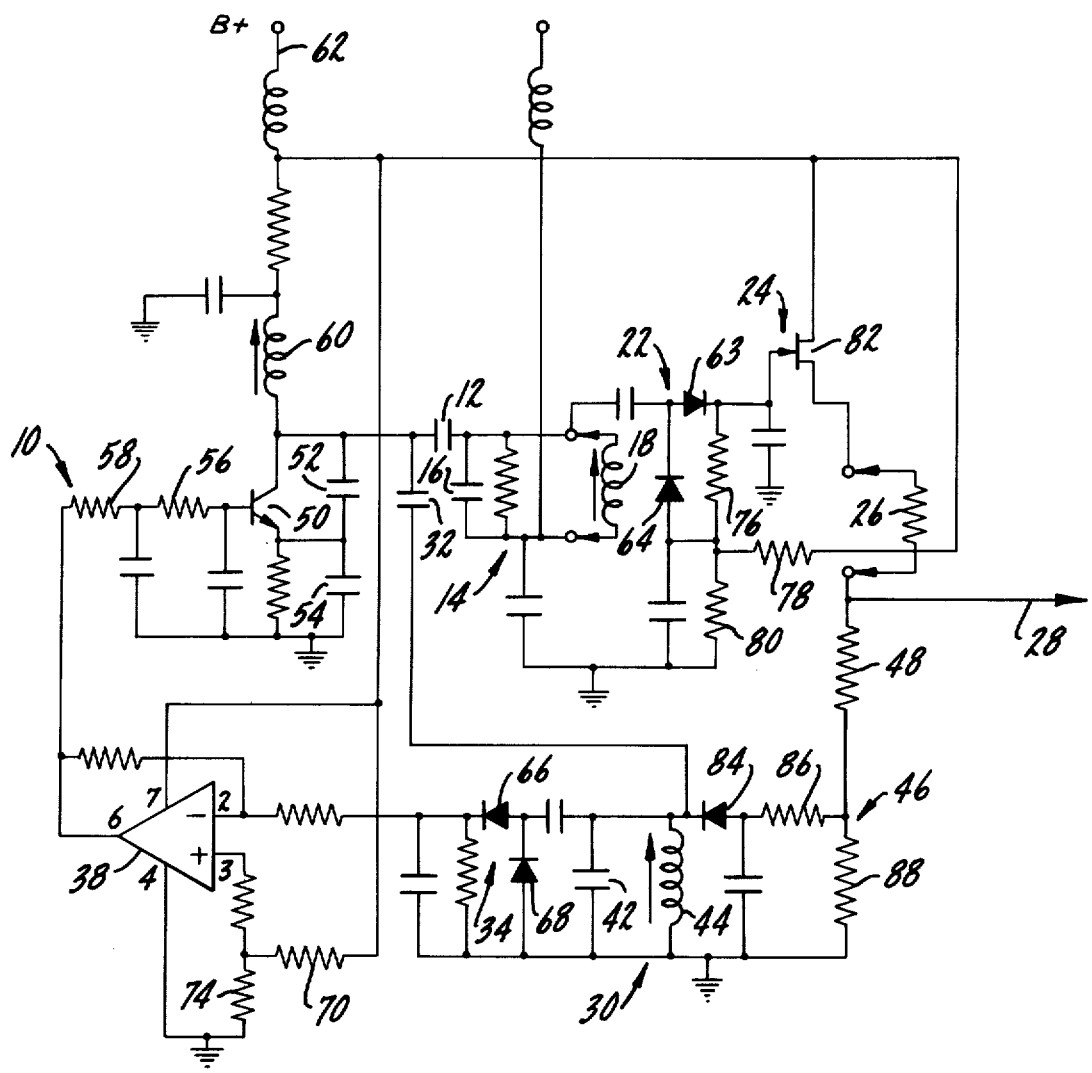
FIG. 2 is a schematic of the circuit of FIG. 1.

In FIG. 2, the oscillator 10 includes a transistor 50 in the form of a Colpitts oscillator in which oscillatory feedback exists between collector and emitter through the tap of capacitances 52 and 54. The base of transistor 50 is grounded from an AC viewpoint and thus this electrode is free to be utilized for AGC control purposes. The base of transistor 50 is connected through resistances 56 and 58 to the output terminal 6 of operational amplifier 38.

The oscillator tank circuit for transistor 50 comprises inductance 60 in parallel with the series combination of capacitances 52 and 54. As indicated above, the oscillator frequency is nominally 8 mhz and the impedance of the tank circuit at this frequency is approximately 4,000 ohms. Inductance 60 is connected to a stable B+ voltage supply, for example 33 volts, as indicated by terminal 62.

The output from oscillator 10 is coupled to two tuned circuits, both of which are resonant at the oscillator frequency, through equal coupling capacitors 12 and 32. The first tuned circuit comprises Q variable inductance 18 in parallel with capacitor 16 and the second comprises inductance 44 in parallel with capacitor 42. Each of the tuned circuits drives a voltage doubler type detector. In the case of sensing detector 22, diodes 63 and 64 are connected to the top of tank circuit 14. In the case of the AGC reference detector 34, diodes 66 and 68 are connected to the top of tank circuit 30.

The output from the AGC reference detector 34 provides one input for operational amplifier 38. The second input is a fixed reference voltage developed at the junction of the voltage divider comprising resistors 70 and 74, the bottom of resistor 74 being connected to ground, with resistor 70 being connected to the stable 33 volt supply of terminal 62. The fixed reference voltage establishes the AGC operating point and hence the absolute magnitude of the DC output of the AGC reference detector and also the absolute magnitude of the maximum DC output from the sensing detector.

A load resistor indicated at 76 is connected to the output of diode 63 and is returned to a platform voltage developed at the junction of the voltage divider formed by resistors 78 and 80, with the voltage divider being connected across the stable B+ supply. The output from the detector is applied to the gate of a field effect transistor 82 which forms a part of source follower 24. The load of the source follower basically comprises the various resistors designated at 26 in FIG. 1, the particular designated resistor being in series with resistor 48. Thus, the source follower isolates the variable impedance load from detector 22. The output voltage at terminal 28 depends first on which resistor has been selected by the switching mechanism to be connected as resistor 26 and the particular position of the steel core in the chosen Q variable inductor 18.

The negative voltage detector 46 comprises a diode 84, driven by the AGC reference circuit and having as its load resistors 86 and 88.

The values of the various resistances designated by resistor 26 are designed to provide the appropriate mean varactor tuning voltage for each of the 36 channel selection positions, plus the appropriate variable component required to adequately fine tune at each position. At the higher channel frequencies a larger mean tuning voltage is required, as well as a larger variable fine tuning component. At the lower channel frequencies a smaller mean tuning voltage is required, as well as a smaller variable tuning component. These voltages are effectively provided by appropriate selection of the values of resistors 26. However, because of the extreme non-linear characteristics of varactor tuning curves, and because of the wide spread between individual curves, it has been found that a greater proportion of the variable component is required at the lowest channel, where the values of resistor 26 are maximum and where the control voltage outputs from the divider is minimum. For this reason, the bottom of resistor 48 is not returned to ground, but rather to a source of negative voltage designated by negative voltage detector 46. The effect of returning resistor 46 to a negative voltage increases the ratio of the variable to fixed components of the varactor control voltage obtained from the junction of resistors 26 and resistor 48 at the lower control voltages, while only slightly affecting the ratio at the higher voltages. The negative potential derived from the negative voltage detector is very stable because the AGC reference circuit which drives this circuit is tightly controlled by the automatic gain control action.

Of importance in the invention is the fact that the numerous potentiometers customarily used in control circuits of the type described have been eliminated and replaced by Q variable inductances. The AGC reference circuit and the sensing circuit are symmetrically coupled to the oscillator 10 and as closely as possible are themselves symmetrical, with the values of capacitors 42 and 16 being matched, as well as the values of coils 44 and 18.

Both steel and aluminum cores would yield a substantial change in the amplitude of the signal developed across the sensing circuit and hence in the rectified output from the sensing detector. In the case of the aluminum core, the change of amplitude is a consequence of detuning the coil, rather than of degrading its Q. However, of concern is the temperature coefficients of reactance of the tuning components of all three tuned circuits which have minimum effect when all three circuits are tuned to resonance. If the adjustable core of the sensing circuit detuned this circuit, then the oscillator frequency would be on the slope of its resonance curve, rather than on the peak, and voltage variations due to temperature coefficients of reactance would be unacceptably large. By using a non-detuning steel core, which varies only Q, all circuits remain at resonance and detuning effects due to temperature are minimized.

The voltage doubler detectors are important as they permit an approximate fifty percent reduction in the magnitude of the AC signal required by the oscillator, and hence a reduction in the required B+ and total power consumption. It should be noted that the variable voltage component from detector 22 is added to a platform voltage to provide an appropriate ratio of variable to mean tuning voltage for all channel positions.

To briefly summarize the operation, the sensing detector 22 rectifies the AC voltage, coupled from oscillator 10 through capacitor 12, which AC voltage is developed across the sensing circuit formed by capacitor 16 and Q variable inductance 18. The magnitude of the voltage is dependent upon the Q of the particular chosen coil which in turn is dependent upon the fine tuning adjustment of the steel screw core. Thus, the sensing detector output forms the variable component of the varactor control voltage.

The AGC feedback system provides the necessary stability required for the varactor control voltages.

Whereas the preferred form of the invention has been shown and described herein, it should be realized that there may be many modifications, substitutions and alterations thereto.

The embodiments of the invention in which an exclusive property or privilege is claimed are defined as follows:

1. A circuit for providing TV channel selection and tuning voltages, including a voltage source, a plurality of fixed resistive means and switch means for connecting predetermined resistive means to said source for providing channel selection voltages, a generally constant frequency oscillator, sensing circuit means coupled to said oscillator and including a plurality of Q variable inductances each having a coil and an adjustable core, switch means for connecting predetermined inductances into said sensing circuit, and detecting means connected to said sensing circuit means for rectifying the output from said sensing circuit means for providing a tuning voltage, the output from said detecting means being connected to said resistive means.

2. The circuit of claim 1 further characterized in that said sensing circuit includes the parallel combination of a capacitor and a variable Q inductance, there being a Q variable inductance for each TV channel selection switch position.

3. The circuit of claim 1 further characterized in that said sensing circuit is capacitively coupled to said oscillator.

4. The circuit of claim 1 further characterized in that each Q variable inductance includes an adjustable steel core.

5. The circuit of claim 1 further characterized by and including a resistor for each TV channel selection switch position.

6. The circuit of claim 1 further characterized by and including automatic gain control means connected in parallel with said oscillator.

7. The circuit of claim 6 further characterized in that said AGC includes a reference circuit formed by the combination of a capacitance and inductance and a detection circuit.

8. The circuit of claim 7 further characterized in that said AGC reference circuit is capacitively coupled to said oscillator, said sensing circuit being capacitively coupled to said oscillator with a capacitor which is substantially identical to that coupling the AGC reference circuit to said oscillator.

9. The circuit of claim 7 further characterized in that said sensing circuit includes the parallel combination of a capacitor and a Q variable inductance, said sensing circuit capacitor and inductance being matched with said reference circuit capacitor and inductance.

10. The circuit of claim 7 further characterized in that said AGC circuit includes an operation amplifier, the input terminals of which are connected to said AGC detector and to a fixed reference voltage.

11. The circuit of claim 7 characterized in that said AGC detection circuit includes voltage doubling means.

12. The circuit of claim 11 further characterized in that said voltage doubling means includes a pair of diodes.

13. The circuit of claim 1 further characterized in that said detecting means includes voltage doubling means.

14. The circuit of claim 13 further characterized in that said voltage doubling means includes a pair of diodes.

15. The circuit of claim 1 further characterized by and including a source follower circuit connected to the output of said detecting means and connected to said resistive means.

16. The circuit of claim 1 further characterized by and including common switch means for connecting said resistive means and said Q variable inductances, there being a Q variable inductance and fixed resistive element for each channel position of said switch means.

17. The circuit of claim 1 further characterized by and including a source of negative voltage connected to one side of said fixed resistive means.

18. A circuit for providing a tuning voltage including a generally constant frequency oscillator, sensing circuit means coupled to said oscillator and including a plurality of Q variable inductances each having a coil and an adjustable core, formed of a material such that movement of the core varies the Q of the coil with essentially no change in coil inductance, switch means for connecting predetermined inductances into said sensing circuit means, and detecting means connected to said sensing circuit means for rectifying the output from said sensing circuit means for providing a tuning voltage.

19. The circuit of claim 18 further characterized in that each Q variable inductance includes an adjustable steel core.

20. The structure of claim 18 further characterized in that each Q variable inductance includes an adjustable core formed of a material having high resistivity in comparison with aluminum and a permeability in excess of unity.

* * * * *